US009255966B2

(12) United States Patent
Onodera

(10) Patent No.: US 9,255,966 B2
(45) Date of Patent: Feb. 9, 2016

(54) RECEIVER CIRCUIT, SEMICONDUCTOR INTEGRATED CIRCUIT, AND TEST METHOD

(71) Applicant: SOCIONEXT INC., Yokohama-shi, Kanagawa (JP)

(72) Inventor: Mitsuru Onodera, Akiruno (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/176,901

(22) Filed: Feb. 10, 2014

(65) Prior Publication Data

US 2014/0269872 A1 Sep. 18, 2014

(30) Foreign Application Priority Data

Mar. 13, 2013 (JP) .................................. 2013-049807

(51) Int. Cl.
*G01R 31/317* (2006.01)
*H04L 1/20* (2006.01)
(52) U.S. Cl.
CPC .......... *G01R 31/31709* (2013.01); *H04L 1/205* (2013.01)
(58) Field of Classification Search
CPC .. G01R 31/31709; H04L 1/205; H04L 1/244; H03M 1/0836; H04B 17/0085; H04B 3/462
USPC ......................................... 375/226, 371–376
See application file for complete search history.

(56) References Cited

U.S. PATENT DOCUMENTS

| 2003/0132775 | A1 | 7/2003 | Yamanaka et al. |
| 2005/0134300 | A1 | 6/2005 | Kushiyama et al. |
| 2005/0165573 | A1 | 7/2005 | Takamiya et al. |
| 2008/0224722 | A1* | 9/2008 | Takada ........................... 324/763 |
| 2010/0246655 | A1* | 9/2010 | Tsuchiya et al. ............... 375/226 |
| 2012/0008949 | A1* | 1/2012 | Takahashi et al. .............. 398/58 |

FOREIGN PATENT DOCUMENTS

| JP | 2003-207544 A | 7/2003 |
| JP | 2005-098981 A | 4/2005 |
| JP | 2005-164440 A | 6/2005 |
| JP | 2005-311564 A | 11/2005 |
| JP | 2008-228083 A | 9/2008 |

OTHER PUBLICATIONS

Riccardi et al., "An Attribute-Programmable PRBS Generator and Checker," XILINX, v1.0, Jan. 10, 2011, pp. 1-8.

* cited by examiner

*Primary Examiner* — Curtis Odom
(74) *Attorney, Agent, or Firm* — Arent Fox LLP

(57) ABSTRACT

A receiver circuit includes a CDR circuit, a jitter generator unit, a test pattern generator unit, and a comparator unit. The jitter generator unit generates jitter having first characteristics (frequency and amplitude). The test pattern generator unit generates a test pattern to which the jitter is added, and supplies the test pattern to the CDR circuit. The comparator unit compares a value outputted from the CDR circuit with an expected value and outputs a comparison result.

6 Claims, 18 Drawing Sheets

| MODULATION CODE | JITTER FREQUENCY | JITTER AMPLITUDE |
|---|---|---|
| 0000 | 10KHz | 0.5UI |
| 0001 | 100KHz | 0.5UI |
| 0010 | 1MHz | 0.5UI |
| 0111 | 10MHz | 0.5UI |
| 1000 | 10MHz | 1UI |
| ⋮ | ⋮ | ⋮ |

FIG. 3

| GENERATING POLYNOMIAL |
|---|
| $x^7+x^6+1$ |
| $x^9+x^5+1$ |
| $x^{11}+x^9+1$ |
| $x^{15}+x^{14}+1$ |
| $x^{17}+x^{14}+1$ |
| $x^{20}+x^3+1$ |
| $x^{23}+x^{18}+1$ |
| $x^{29}+x^{27}+1$ |
| $x^{31}+x^{28}+1$ |

FIG. 6

RECEIVER CIRCUIT, SEMICONDUCTOR INTEGRATED CIRCUIT, AND TEST METHOD

CROSS-REFERENCE TO RELATED APPLICATION

This application is based upon and claims the benefit of priority of the prior Japanese Patent Application No. 2013-049807, filed on Mar. 13, 2013, the entire contents of which are incorporated herein by reference.

FIELD

The embodiment discussed herein is related to a receiver circuit, a semiconductor integrated circuit, and a test method.

BACKGROUND

CDR (Clock and Data Recovery) for recovering data and a clock from a received signal is adopted in high-speed interfaces or the like included in semiconductor devices.

For example, the following two methods are used for testing a receiver circuit having a CDR function.

One method is as follows. A tester supplies a test pattern to a receiver circuit and a BIST (Built-In Self Test) circuit included in the receiver circuit determines whether or not the test pattern is held correctly.

The other method is as follows. A transmitter circuit which generates and transmits a test pattern is placed in the same chip where a receiver circuit is placed or outside a chip where a receiver circuit is placed (on an evaluation board, for example). The transmitter circuit and the receiver circuit are connected outside the chip and a loop back test is performed.

With these method, however, a receiver circuit is merely tested under a specific jitter condition realized by a circuit which generates a test pattern. That is to say, a test (jitter tolerance test) for measuring resistance to various jitter characteristics is not performed.

Japanese Laid-open Patent Publication No. 2005-164440
Japanese Laid-open Patent Publication No. 2005-311564

A tester may be used for generating a test pattern having an arbitrary jitter characteristic. In that case, however, the accuracy of a test deteriorates due to loss in a transmission line in the tester or on an evaluation board, impedance mismatch, a measurement error, or the like.

SUMMARY

According to an aspect, there is provided a receiver circuit including a clock data recovery circuit, a jitter generator unit configured to generate jitter having first characteristics, a test pattern generator unit configured to generate a test pattern to which the jitter is added and to supply the test pattern to the clock data recovery circuit, and a comparator unit configured to compare a value outputted from the clock data recovery circuit on the basis of the test pattern with an expected value and to output a comparison result.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is an example of a modulation code;
FIG. 6 is an example of a PRBS generating polynomial.

DESCRIPTION OF EMBODIMENTS

Figure 1:
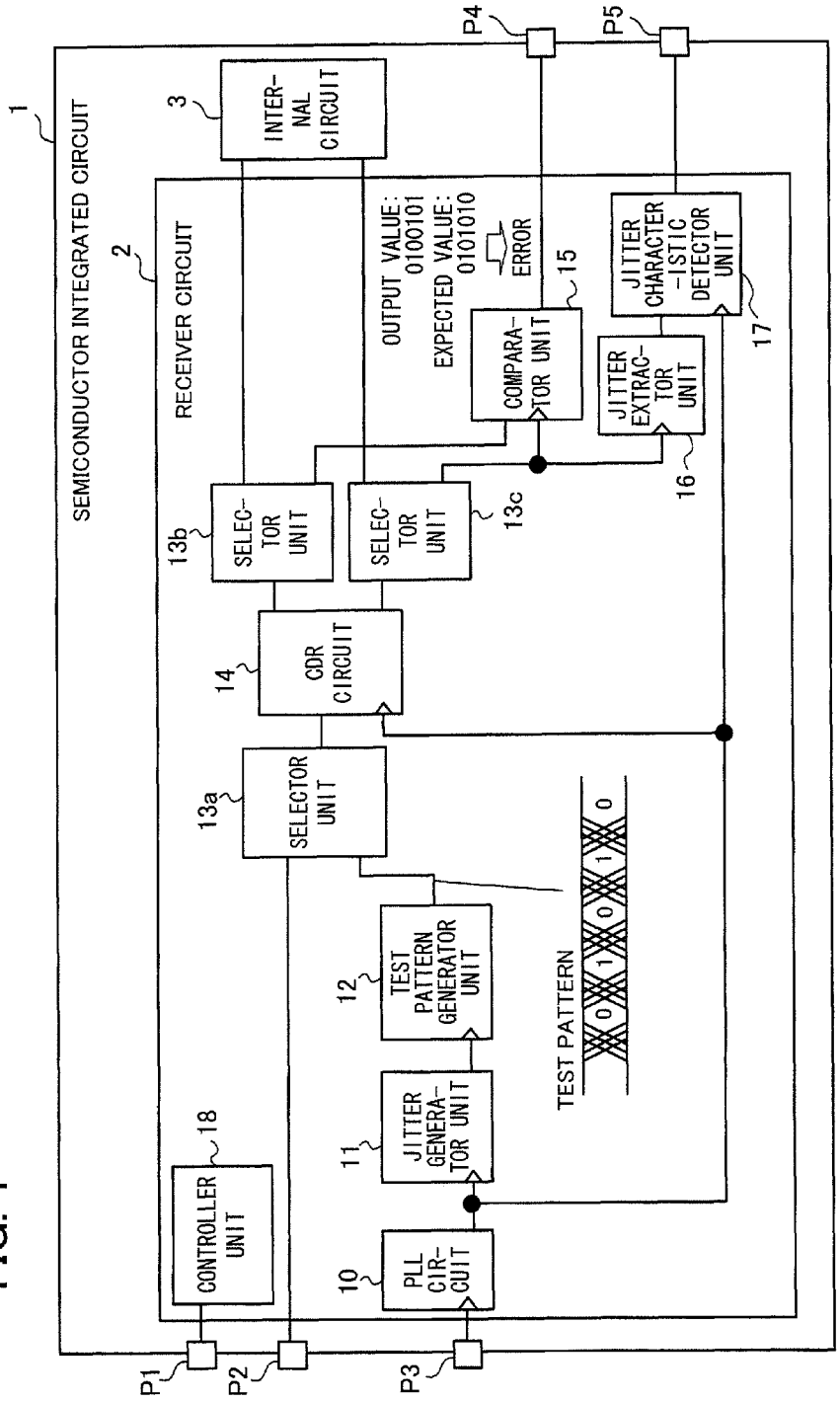
FIG. 1 is an example of a semiconductor integrated circuit according to an embodiment.

An embodiment will now be described with reference to the accompanying drawings, wherein like reference numerals refer to like elements throughout.

FIG. 1 is an example of a semiconductor integrated circuit according to an embodiment.

A semiconductor integrated circuit 1 includes a receiver circuit 2, an internal circuit 3 which performs determined operations on the basis of data and a clock received by the receiver circuit 2, and terminals P1, P2, P3, P4, and P5 which input and output various signals.

The receiver circuit 2 includes a PLL (Phase Locked Loop) circuit 10, a jitter generator unit 11, a test pattern generator unit 12, selector units 13a, 13b, and 13c, a CDR circuit 14, a comparator unit 15, a jitter extractor unit 16, a jitter characteristic detector unit 17, and a controller unit 18. Each of the jitter generator unit 11, the test pattern generator unit 12, the selector units 13a, 13b, and 13c, the comparator unit 15, the jitter extractor unit 16, the jitter characteristic detector unit 17, and the controller unit 18 is realized as, for example, a circuit in the receiver circuit 2.

The jitter generator unit 11 receives via the PLL circuit 10 a reference clock inputted from the terminal P3, and generates jitter having determined characteristics. The characteristics of jitter include, for example, the frequency and amplitude of the jitter.

The test pattern generator unit 12 generates a test pattern to which jitter generated by the jitter generator unit 11 is added, and supplies the test pattern to the CDR circuit 14 via the selector unit 13a at the time of a jitter tolerance test.

At normal operation time the selector unit 13a selects received data inputted from the terminal P2 and supplies it to the CDR circuit 14, under the control of the controller unit 18. At the time of a jitter tolerance test, the selector unit 13a selects a test pattern generated by the test pattern generator unit 12 and supplies it to the CDR circuit 14, under the control of the controller unit 18.

At normal operation time the selector unit 13b supplies a value (parallel data) outputted from the CDR circuit 14 to the internal circuit 3 under the control of the controller unit 18. At the time of a jitter tolerance test, the selector unit 13b supplies a value outputted from the CDR circuit 14 to the comparator unit 15 under the control of the controller unit 18.

At normal operation time the selector unit 13c supplies a clock (recovered clock) recovered by the CDR circuit 14 to the internal circuit 3 under the control of the controller unit 18. At the time of a jitter tolerance test, the selector unit 13c supplies a recovered clock to the comparator unit 15 and the jitter extractor unit 16 under the control of the controller unit 18.

The CDR circuit 14 receives a reference clock from the PLL circuit 10, holds received data or a test pattern outputted from the selector unit 13a, and extracts a recovered clock from the received data or the test pattern.

The comparator unit 15 compares a value outputted from the CDR circuit 14 with an expected value and outputs a comparison result. The expected value corresponds to a test pattern generated by the test pattern generator unit 12. The comparator unit 15 may generate and hold the expected value or receive the expected value generated outside the comparator unit 15.

The jitter extractor unit 16 is, for example, a band-pass filter and extracts jitter from a recovered clock.

The jitter characteristic detector unit 17 detects characteristics of jitter extracted by the jitter extractor unit 16. Then the jitter characteristic detector unit 17 evaluates the characteristics of the extracted jitter with a characteristic value (frequency and amplitude) of jitter set by the jitter generator unit 11 as an expected value, and outputs an evaluation result.

The controller unit 18 controls a test on the receiver circuit 2. A control signal line from the controller unit 18 to each unit is not illustrated.

An example of the operation of the semiconductor integrated circuit 1 at the time of a jitter tolerance test will now be described briefly.

When a reference clock is inputted from a tester (not illustrated) to the semiconductor integrated circuit 1, the PLL circuit 10 supplies the reference clock to the jitter generator unit 11 at a determined frequency. The jitter generator unit 11 generates jitter of a determined frequency and determined amplitude on the reference clock. As a result, a rising edge and a falling edge of the reference clock fluctuate at the determined frequency and amplitude.

On the basis of the reference clock including the jitter, the test pattern generator unit 12 generates a test pattern to which the jitter is added. In the example of FIG. 1, a test pattern which makes the transitions from "0" to "1", from "1" to "0", from "0" to "1", and from "1" to "0" is generated. Fluctuations corresponding to the frequency and amplitude of the generated jitter occur at portions (edges) at which the signal makes a transition.

The CDR circuit 14 receives the serial test pattern including the jitter, receives the reference clock from the PLL circuit 10, and outputs a parallel output value corresponding to the test pattern and a recovered clock.

The comparator unit 15 compares the output value from the CDR circuit 14 with an expected value. For example, if the expected value is "0101010" and the output value from the CDR circuit 14 is "0100101", then the comparator unit 15 determines that the test pattern is not held correctly. In this case, the comparator unit 15 outputs a signal to the effect that an error has occurred, and gives, for example, the tester (not illustrated) notice via the terminal P4. If the output value matches the expected value, then the comparator unit 15 transmits to the tester a signal to that effect.

On the other hand, the jitter extractor unit 16 extracts jitter from the recovered clock. The jitter characteristic detector unit 17 detects characteristics (frequency and amplitude) of the jitter. Then the jitter characteristic detector unit 17 evaluates the characteristics of the extracted jitter with a characteristic value (frequency and amplitude) of the jitter set by the jitter generator unit 11 as an expected value, and outputs an evaluation result.

The above jitter tolerance test shows jitter whose characteristics make it impossible for the CDR circuit 14 to correctly hold data. Furthermore, if determined jitter is generated by a tester to perform a test, the accuracy of the test deteriorates due to, for example, loss in a transmission line. In this embodiment, however, jitter having determined characteristics is generated in the receiver circuit 2. Accordingly, loss in a transmission line or the like does not occur and the accuracy of a test is improved.

In addition, a tester which generates jitter having determined characteristics is unnecessary. As a result, a jitter tolerance test can be performed by the use of an inexpensive tester. This reduces the costs of a test.

Moreover, jitter is extracted from a recovered clock and the frequency and amplitude of the jitter are detected. As a result, not only a time-domain test for checking whether data is held correctly but also a frequency-domain test can be performed. Accordingly, the jitter tolerance characteristic of the CDR circuit 14 can be evaluated more accurately.

An example of each of the jitter generator unit 11, the test pattern generator unit 12, the CDR circuit 14, the comparator unit 15, the jitter extractor unit 16, and the jitter characteristic detector unit 17 included in the receiver circuit 2 in this embodiment will now be described in further detail.

(Jitter Generator Unit)

Figure 2:
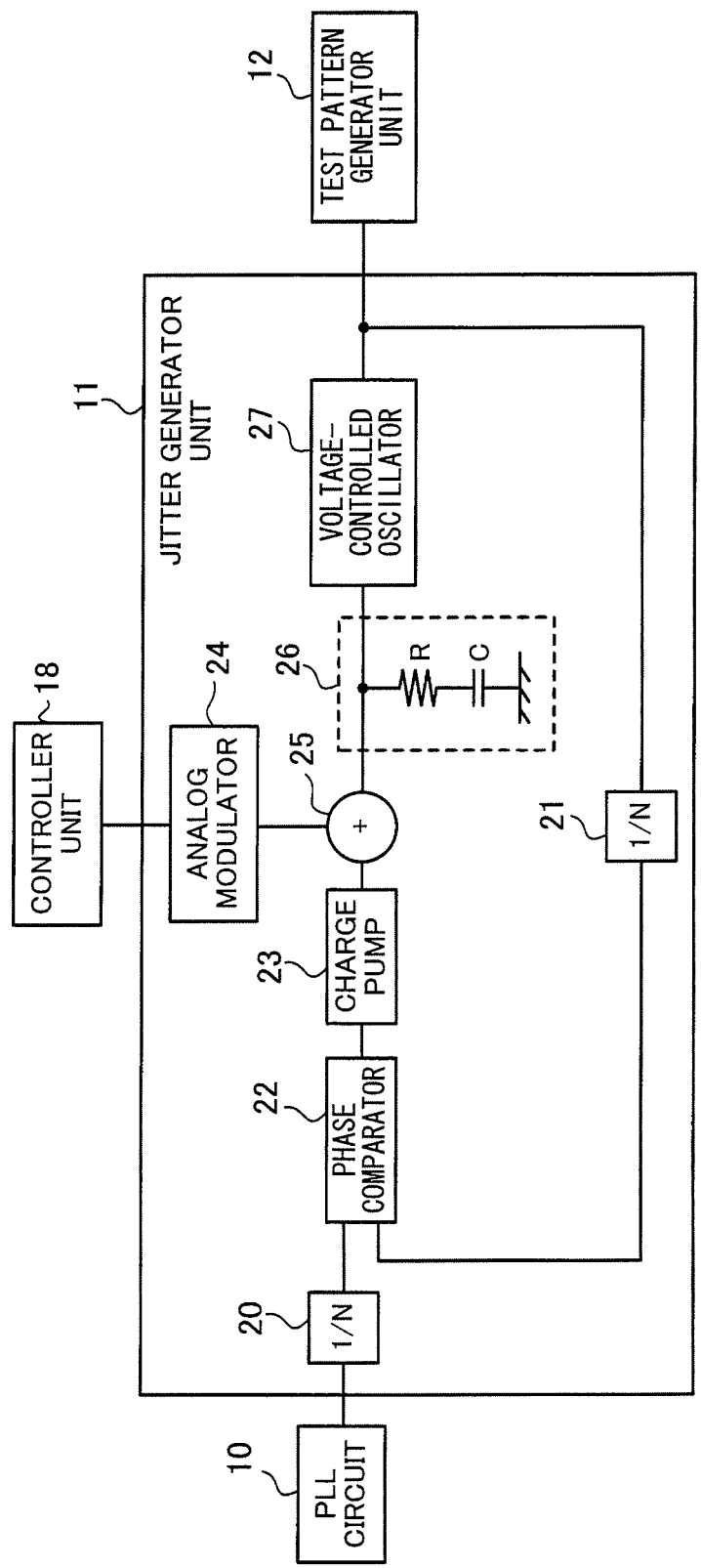
FIG. 2 is an example of a jitter generator unit.

FIG. 2 is an example of the jitter generator unit.

In this example, an SSCG (Spread Spectrum Clock Generator) is used as the jitter generator unit 11. The jitter generator unit 11 includes 1/N frequency dividers 20 and 21, a phase comparator 22, a charge pump 23, an analog modulator 24, a voltage adder 25, a loop filter 26 having resistance R and capacitance C, and a voltage-controlled oscillator 27.

In this jitter generator unit 11 a reference clock from the PLL circuit 10 is inputted to the 1/N frequency divider 20 and a phase of a signal outputted from the 1/N frequency divider 20 and a phase of a signal outputted from the 1/N frequency divider 21 are compared by the phase comparator 22. The phase comparator 22 supplies a comparison result (digital signal) to the charge pump 23 and the charge pump 23 generates an analog signal corresponding to the comparison result.

The analog modulator 24 generates jitter according to a modulation code (information regarding a jitter frequency and jitter amplitude) transmitted from the controller unit 18.

FIG. 3 is an example of a modulation code.

Examples of a jitter frequency and jitter amplitude corresponding to each 4-bit modulation code are indicated. For example, if a modulation code is "1000", then jitter of 10 MHz and 1 UI (Unit Interval) is generated.

Jitter is added by the voltage adder 25 to the analog signal generated by the charge pump 23. An analog signal obtained by adding the jitter is transmitted to the voltage-controlled oscillator 27 via the loop filter 26 to control an oscillation frequency of the voltage-controlled oscillator 27. A signal outputted from the voltage-controlled oscillator 27 is inputted to the test pattern generator unit 12 and is inputted to the phase comparator 22 via the 1/N frequency divider 21.

Jitter generated by the jitter generator unit is determined by a desired test specification. For example, jitter is determined by total jitter=sine wave+random jitter and the characteristics of the jitter generator unit 11 are determined on the basis of this expression.

In the example of FIG. 2, an SSCG is used as the jitter generator unit 11. However, another phase (or delay) modulation circuit may be used.

Figure 4:
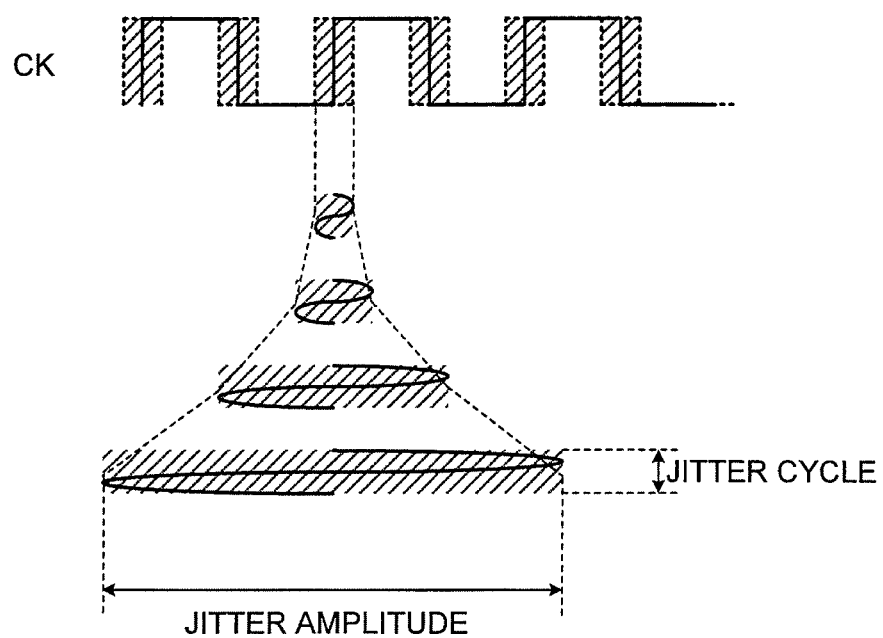
FIG. 4 is an example of a reference clock to which jitter has been added by the jitter generator unit.

FIG. 4 is an example of a reference clock to which jitter has been added by the jitter generator unit.

Each edge of a reference clock CK fluctuates due to jitter in a range indicated by oblique lines. Jitter amplitude and a jitter cycle change according to the values of the above modulation codes. A jitter cycle is the reciprocal of a jitter frequency.

Figure 5:
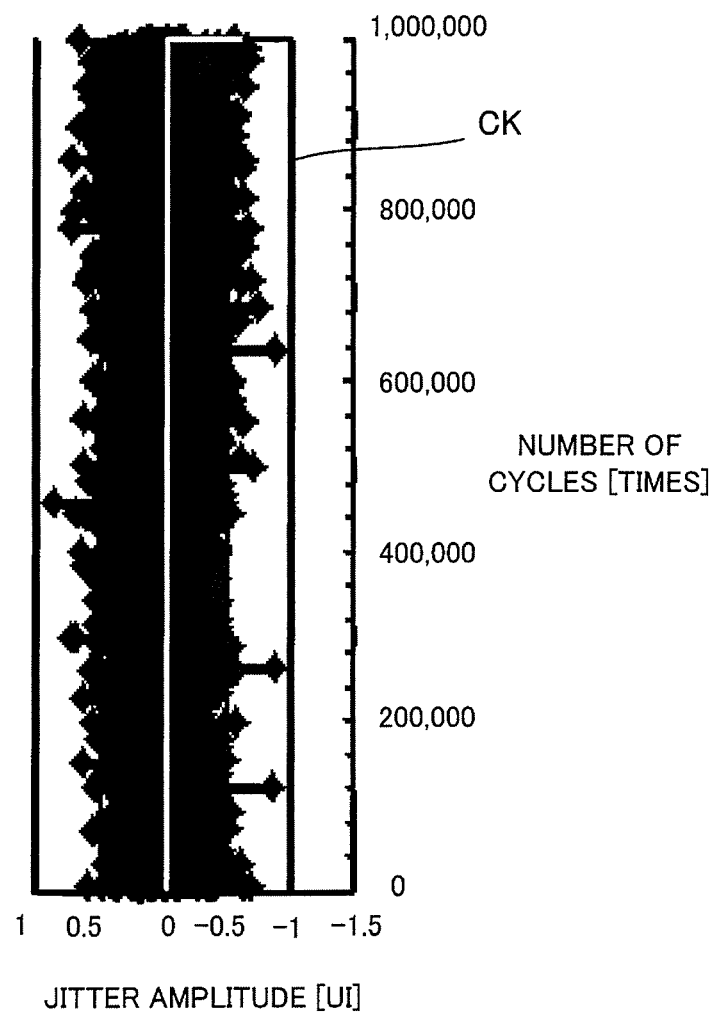
FIG. 5 is an example of a simulation of fluctuations relative to an ideal edge of a reference clock.

FIG. 5 is an example of a simulation of fluctuations relative to an ideal edge of a reference clock. In FIG. 5, a horizontal axis indicates jitter amplitude [UI] and a vertical axis indicates the number of cycles [times].

In FIG. 5, fluctuations of a rising edge relative to a reference clock CK at the time of jitter amplitude and a jitter frequency being 1 UI and 1 MHz, respectively, are plotted. 1-MHz jitter is plotted 1,000,000 times.

(Test Pattern Generator Unit)

A PRBS (Pseudo-Random Bit Sequence) generation circuit or the like is used as the test pattern generator unit 12.

FIG. 6 is an example of a PRBS generating polynomial.

The test pattern generator unit 12 generates a test pattern, which is a random bit string, by a random number algorithm using a generating polynomial like those indicated in FIG. 6.

The above jitter has been added to a reference clock inputted to the test pattern generator unit 12. Accordingly, as illustrated in FIG. 1, fluctuations corresponding to set jitter characteristics occur at each portion at which a test pattern signal makes a transition.

(CDR Circuit)

Figure 7:
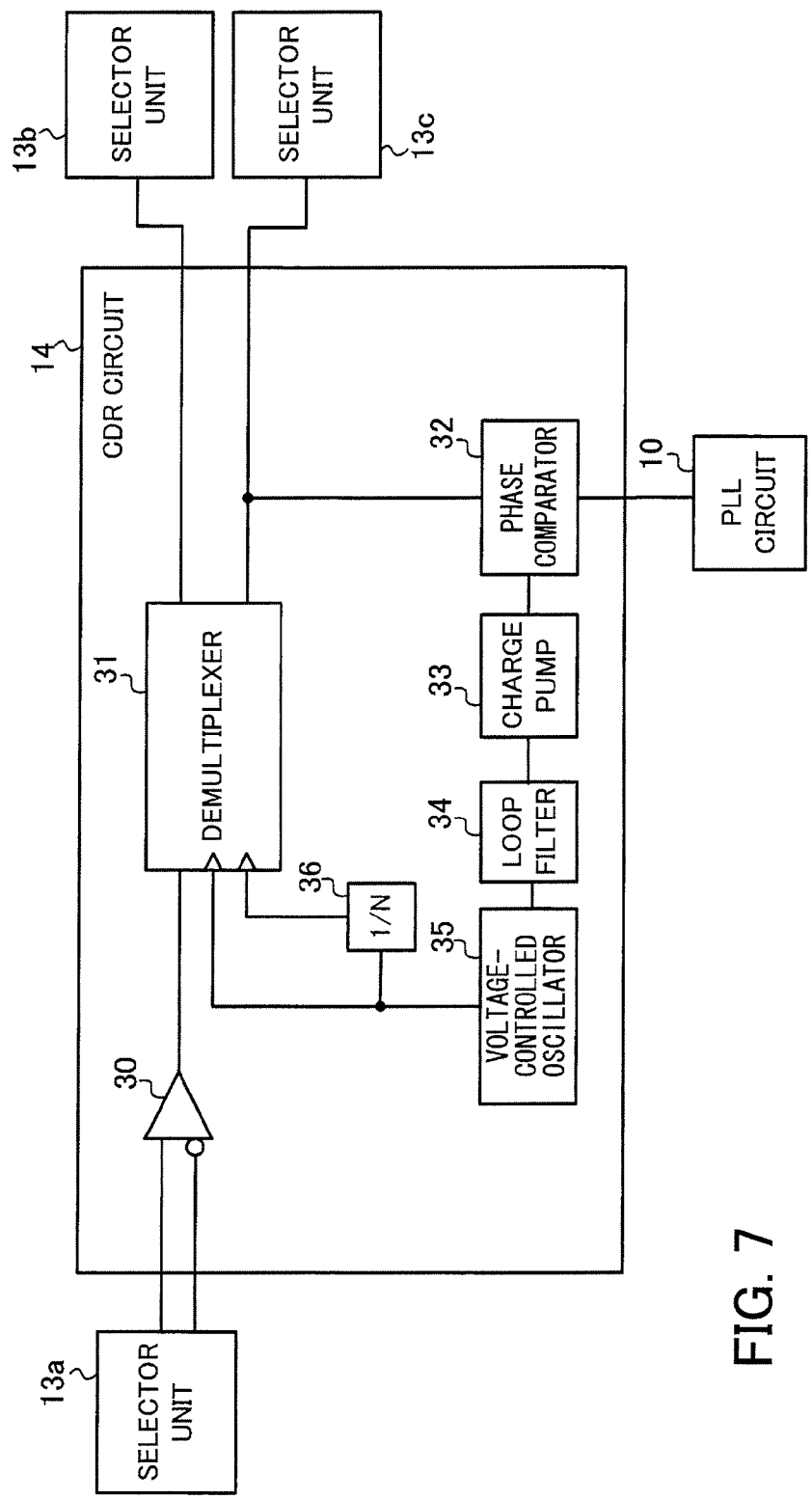
FIG. 7 is an example of a CDR circuit.

FIG. 7 is an example of the CDR circuit.

The CDR circuit 14 includes an amplifier 30, a demultiplexer 31, a phase comparator 32, a charge pump 33, a loop filter 34, a voltage-controlled oscillator 35, and a 1/N frequency divider 36.

In the example of FIG. 7, it is assumed that received data or a test pattern, which is a differential signal and serial data, is inputted to the amplifier 30 of the CDR circuit 14. A signal outputted from the amplifier 30 is inputted to the demultiplexer 31. In addition, a signal outputted from the voltage-controlled oscillator 35 is inputted to the demultiplexer 31. Furthermore, the signal outputted from the voltage-controlled oscillator 35 is frequency-divided by the 1/N frequency divider 36 and is inputted to the demultiplexer 31.

On the basis of these input signals, the demultiplexer 31 recovers the received data or the test pattern as parallel data and outputs a recovered clock. For example, if the 1/N frequency divider 36 performs 1/10 frequency division, then the demultiplexer 31 outputs 10 pieces of parallel data.

The recovered clock is compared with a reference clock outputted from the PLL circuit 10 by the phase comparator 32 and a comparison result (digital signal) is supplied to the charge pump 33. The charge pump 33 generates an analog signal corresponding to the comparison result. The analog signal is transmitted to the voltage-controlled oscillator 35 via the loop filter 34 to control an oscillation frequency of the voltage-controlled oscillator 35.

(Comparator Unit)

The comparator unit 15 includes, for example, the above PRBS generation circuit and uses a generating polynomial like those indicated in FIG. 6 for generating an expected value corresponding to a test pattern generated by the test pattern generator unit 12. Furthermore, at the time of a jitter tolerance test, the comparator unit 15 receives a value outputted from the CDR circuit 14 via the selector unit 13b and compares it with the expected value.

An example of an internal waveform of a CDR circuit 14 without a jitter generator unit 11 will be described for comparison before an example of a comparison made by the receiver circuit 2 in this embodiment is described.

Figure 8:
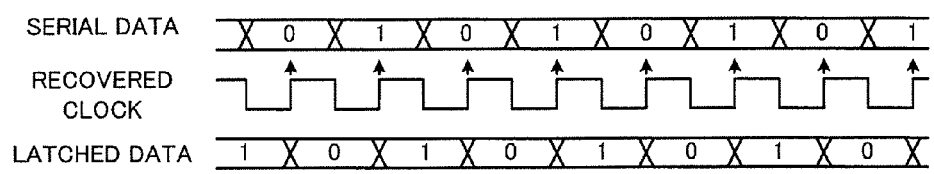
FIG. 8 is a first example of an internal waveform of a CDR circuit without a jitter generator unit.

FIG. 8 is a first example of an internal waveform of a CDR circuit without a jitter generator unit.

FIG. 8 indicates examples of serial data and a recovered clock inputted to a CDR circuit 14 and latched data held by the CDR circuit 14. As indicated in FIG. 8, if a rising edge of the recovered clock is not at a boundary portion between values included in the serial data (data boundary), then the serial data is held correctly.

Figure 9:
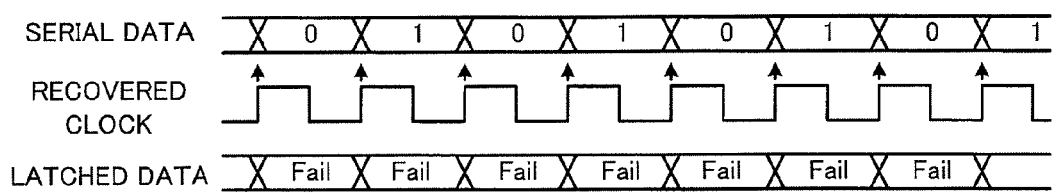
FIG. 9 is a second example of an internal waveform of a CDR circuit without a jitter generator unit.

FIG. 9 is a second example of an internal waveform of a CDR circuit without a jitter generator unit.

FIG. 9 indicates examples of serial data and a recovered clock inputted to a CDR circuit 14 and latched data held by the CDR circuit 14. As indicated in FIG. 9, if a rising edge of the recovered clock is at a boundary portion between values included in the serial data, then the serial data is not held correctly and "Fail" occurs. If such a result is obtained, it is impossible to determine whether a failure has occurred in the circuit or "Fail" has occurred in a test environment. The reason for this is that jitter which has been added to the serial data is unknown.

On the other hand, the receiver circuit 2 in this embodiment includes the jitter generator unit 11 and an internal waveform of the CDR circuit 14 is as follows.

Figure 10:
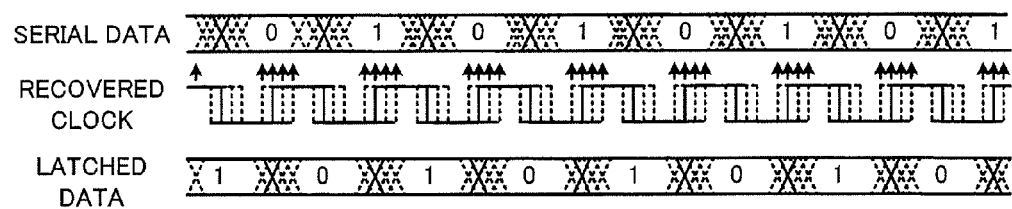
FIG. 10 is an example of an internal waveform of the CDR circuit in the receiver circuit in the embodiment.

FIG. 10 is an example of an internal waveform of the CDR circuit in the receiver circuit in the embodiment.

FIG. 10 indicates examples of serial data and a recovered clock inputted to the CDR circuit 14 and latched data held by the CDR circuit 14. As indicated in FIG. 10, fluctuations occur at each edge portion of the serial data and the recovered clock according to the frequency and amplitude of jitter generated by the jitter generator unit 11. Accordingly, a plurality of edges appear on the recovered clock according to the frequency and amplitude of jitter and jitter which makes it possible to correctly hold the serial data can be determined. In the case of FIG. 10, any edge makes it possible to correctly hold the serial data. In such a case, a value outputted from the CDR circuit 14 matches an expected value and the comparator unit 15 outputs a comparison result to the effect that the serial data is held correctly.

(Jitter Extractor Unit)

Figure 11:
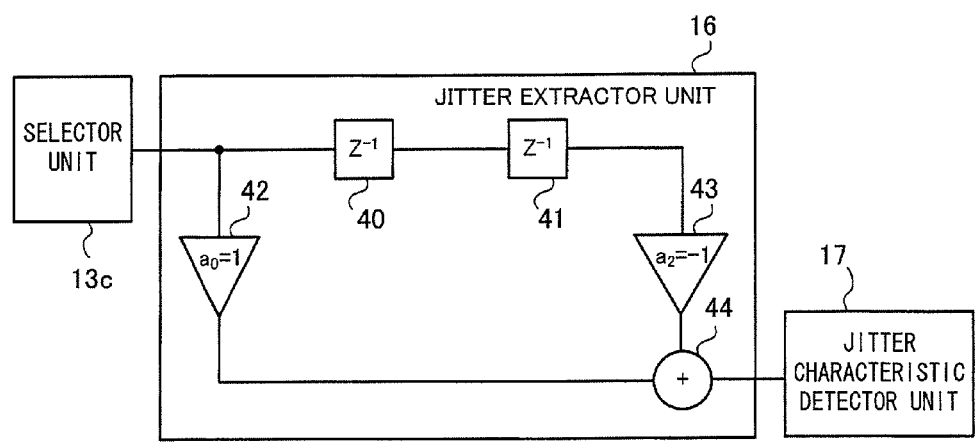
FIG. 11 is an example of a jitter extractor unit.

FIG. 11 is an example of the jitter extractor unit.

The jitter extractor unit 16 is, for example, a band-pass filter which is a second-order digital filter, and includes delay circuits (indicated by $Z^{-1}$ in FIG. 11) 40 and 41, multipliers 42 and 43, and an adder 44. Parameters of the delay circuits 40 and 41 and the multipliers 42 and 43 are controlled according to the characteristics of jitter to be extracted. In the example of FIG. 11, the parameters of the multipliers 42 and 43 are $a_0=1$ and $a_2=-1$ respectively.

A recovered clock inputted to the jitter extractor unit 16 is multiplied by $a_0=1$ by the multiplier and is inputted to the adder 44. In addition, the recovered clock is delayed by the delay circuits 40 and 41, is multiplied by $a_2=-1$ by the multiplier 43, and is inputted to the adder 44. The adder 44 adds together the signals outputted from the multipliers 42 and 43 and outputs jitter as a digital signal.

Figure 12:
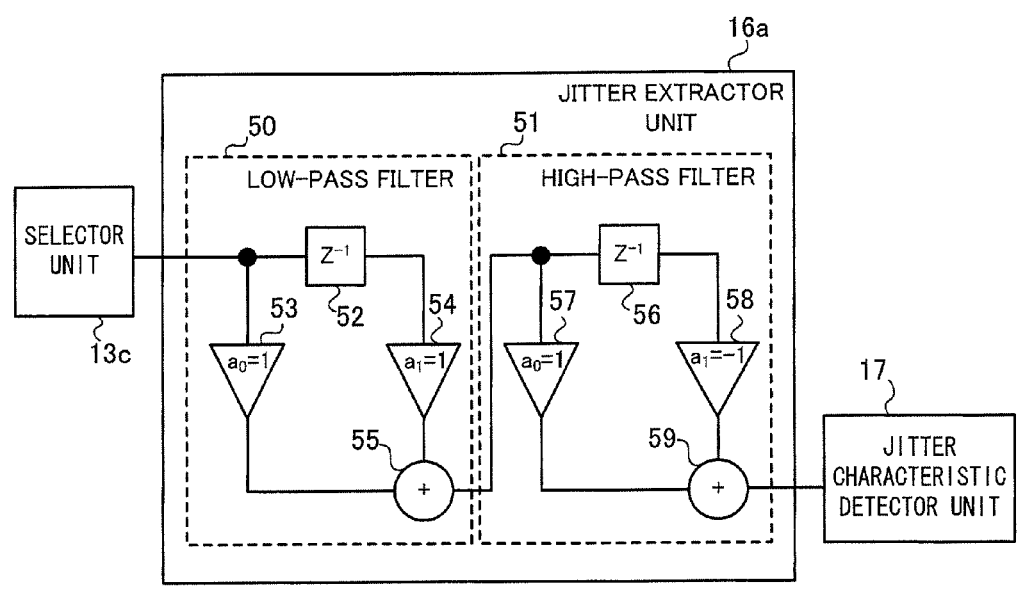
FIG. 12 is another example of a jitter extractor unit.

FIG. 12 is another example of a jitter extractor unit.

A jitter extractor unit 16a is a band-pass filter which is a second-order digital filter. This is the same with the jitter extractor unit 16 illustrated in FIG. 11. However, the jitter extractor unit 16a includes a first-order low-pass filter 50 and a first-order high-pass filter 51.

The low-pass filter 50 includes a delay circuit 52, multipliers 53 and 54, and an adder 55. Similarly, the high-pass filter 51 includes a delay circuit 56, multipliers 57 and 58, and an adder 59. Parameters of the delay circuits 52 and 56 and the multipliers 53, 54, 57, and 58 are controlled according to the characteristics of jitter to be extracted. In the example of FIG. 12, the parameters of the multipliers 53 and 54 are $a_0=1$ and $a_1=1$, respectively, and the parameters of the multipliers 57 and 58 are $a_0=1$ and $a_1=-1$, respectively.

A recovered clock inputted to the jitter extractor unit 16a is multiplied by $a_0=1$ by the multiplier 53 of the low-pass filter 50 and is inputted to the adder 55. In addition, the recovered clock is delayed by the delay circuit 52, is multiplied by $a_1=1$ by the multiplier 54, and is inputted to the adder 55. The adder 55 adds together the signals outputted from the multipliers 53 and 54.

An addition result obtained by the adder 55 of the low-pass filter 50 is multiplied by $a_0=1$ by the multiplier 57 of the high-pass filter 51 and is inputted to the adder 59. In addition, the addition result obtained by the adder 55 of the low-pass filter 50 is delayed by the delay circuit 56, is multiplied by $a_1=-1$ by the multiplier 58, and is inputted to the adder 59. The adder adds together the signals outputted from the multipliers 57 and 58 and outputs jitter as a digital signal.

By adopting the above jitter extractor unit 16 or 16a, jitter is extracted from a recovered clock.

In the above examples a second-order digital filter is used. However, an order number may be changed or an analog filter may be used. If a digital filter is used, a function and an operating speed can be verified by a logic scan test. A jitter extractor unit using a digital filter is superior in this respect to a jitter extractor unit using an analog filter.

(Jitter Characteristic Detector Unit)

Figure 13:
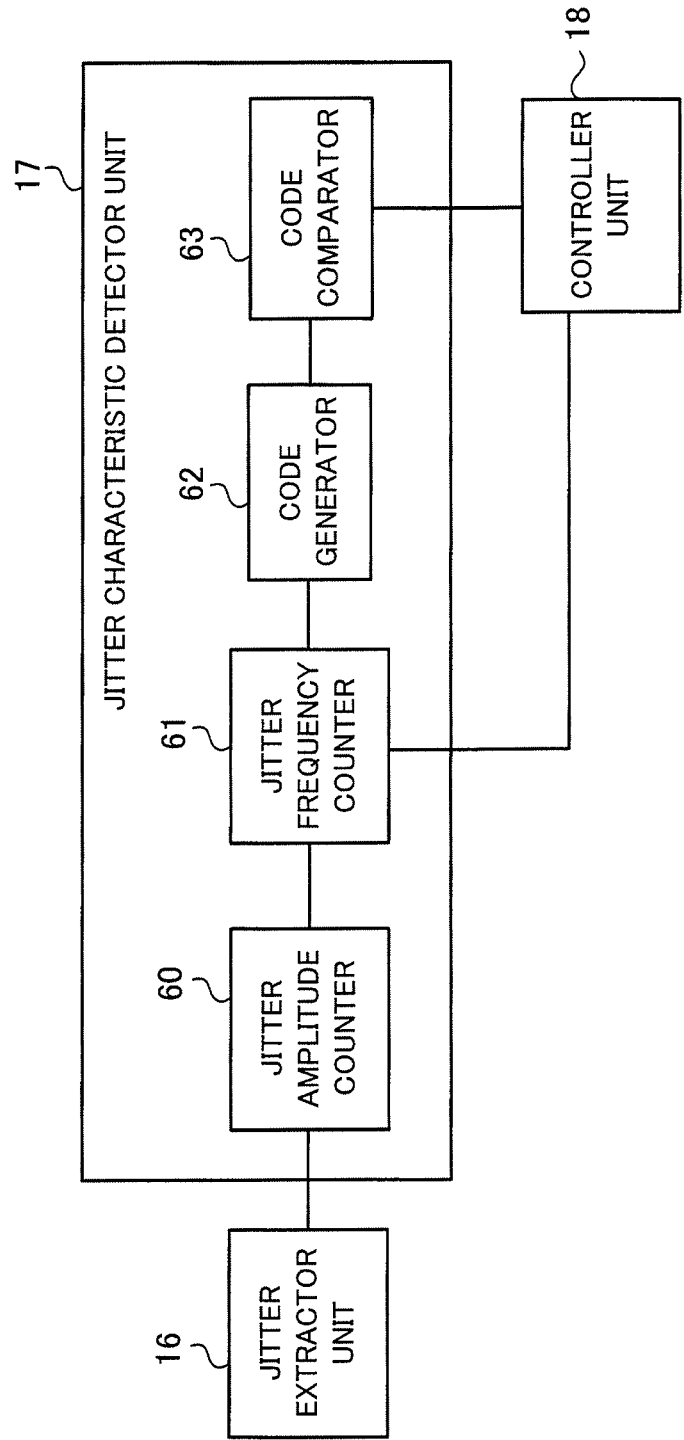
FIG. 13 is an example of a jitter characteristic detector unit.

FIG. 13 is an example of the jitter characteristic detector unit.

The jitter characteristic detector unit 17 includes a jitter amplitude counter 60, a jitter frequency counter 61, a code generator 62, and a code comparator 63.

The jitter amplitude counter 60 counts the amplitude of jitter outputted from the jitter extractor unit 16 as a digital signal.

The jitter frequency counter 61 counts the frequency of jitter by the use of, for example, a clock for time measurement supplied from the controller unit 18. For example, the jitter frequency counter 61 counts the number of clocks of the clock for time measurement from the time when a count value of the jitter amplitude counter 60 is largest to the time when a count value of the jitter amplitude counter 60 is largest next, and finds one cycle (period) of the jitter (1/frequency).

The code generator 62 generates a modulation code like those indicated in FIG. 3 on the basis of count results of the jitter amplitude counter 60 and the jitter frequency counter 61.

The code comparator 63 compares a modulation code which the controller unit 18 sets for the jitter generator unit 11 as an expected value with the modulation code generated by the code generator 62, and outputs a comparison result. Furthermore, the code comparator 63 may output the modulation code generated by the code generator 62.

Figure 14:
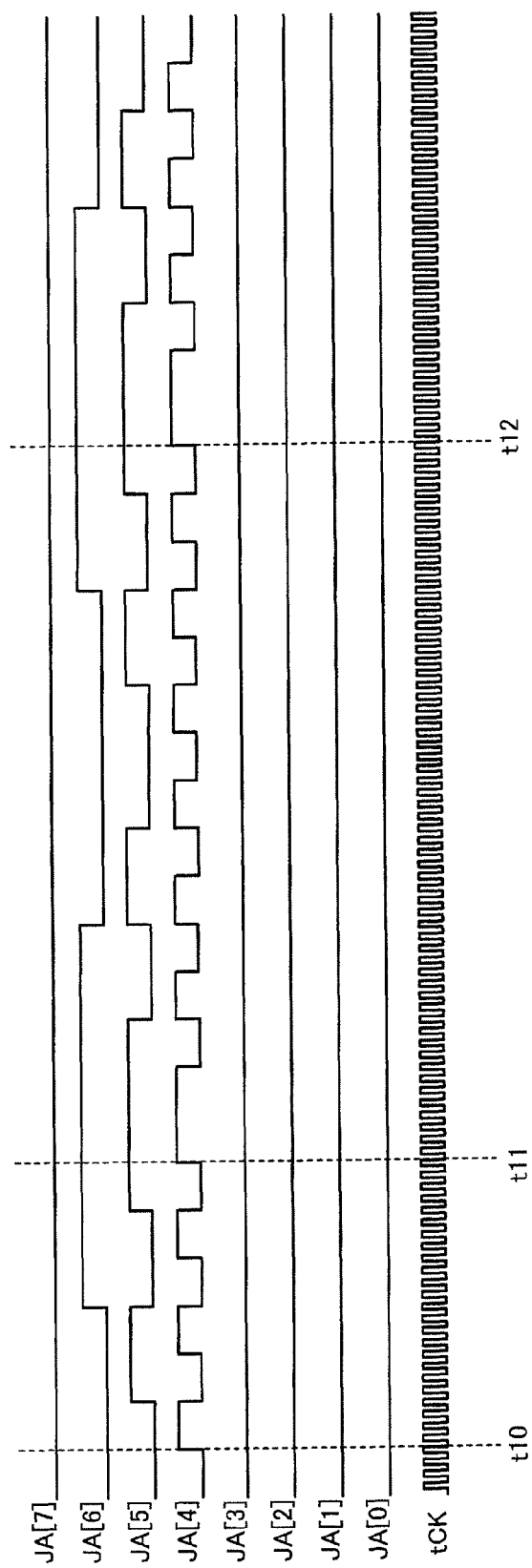
FIG. 14 is a timing chart for describing an example of counting the amplitude and frequency of jitter.

FIG. 14 is a timing chart for describing an example of counting the amplitude and frequency of jitter.

FIG. 14 indicates examples of an 8-bit digital signal (JA(0) through JA(7)) outputted from the jitter extractor unit 16 and a clock tCK for time measurement.

The jitter amplitude counter 60 of the jitter characteristic detector unit 17 considers a low-order bit, of JA(0) through JA(7), which changes as an LSB (Least Significant Bit). In the example of FIG. 14, JA(4) which rises from an L (Low) level to an H (High) level at timing t10 is an LSB.

Jitter which is the digital signal has a maximum of "111" at timing t11 and this is a count value indicative of the amplitude of the jitter.

The jitter frequency counter 61 of the jitter characteristic detector unit 17 counts the number of clocks of the clock tCK from the time when a count value of the jitter amplitude counter 60 has a maximum (timing t11) to the time when a count value of the jitter amplitude counter 60 has a maximum next (timing t12).

For example, if the frequency of the jitter is 1 MHz (cycle of the jitter is 1000 nsec) and the frequency of the clock tCK is 100 MHz (one cycle is 10 nsec), then the number of clocks counted from the timing t11 to t12 is 100. Actually, a slight error occurs. Therefore, if a count value is within the range of, for example, −5 to +5, then the code generator 62 may generate the same code.

(Example of Tester)

Figure 15:
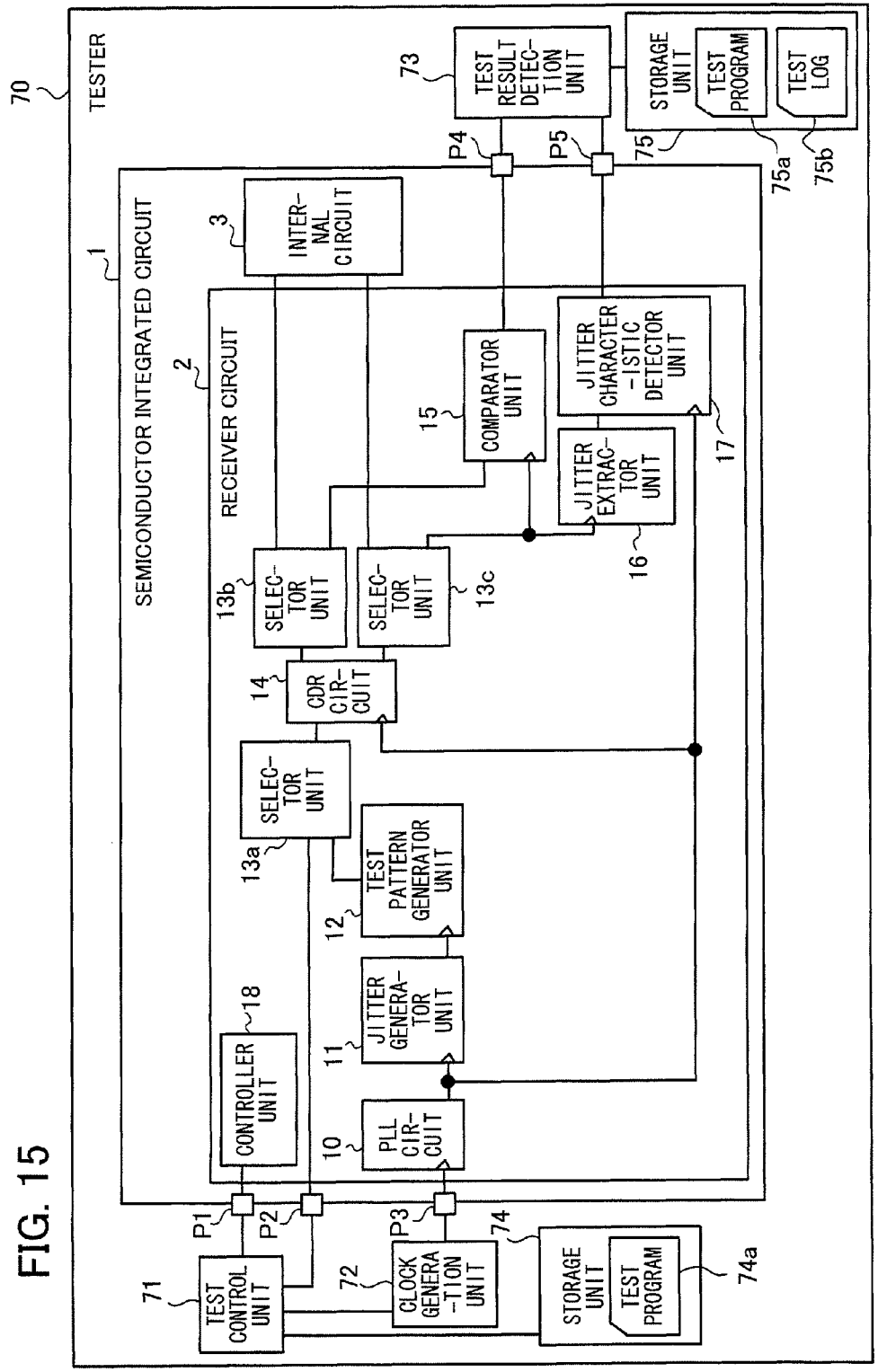
FIG. 15 is an example of a tester which performs a test on a semiconductor integrated circuit.

FIG. 15 is an example of a tester which performs a test on a semiconductor integrated circuit.

A tester 70 includes a test control unit 71, a clock generation unit 72, a test result detection unit 73, and storage units 74 and 75. FIG. 15 indicates a state in which the semiconductor integrated circuit 1 is connected to (mounted on) the tester 70. The semiconductor integrated circuit 1 may be tested in a state in which it is mounted on an evaluation board (not illustrated).

The test control unit 71 supplies to the controller unit 18 of the receiver circuit 2, for example, a control signal to the effect that it performs a jitter tolerance test. In addition, the test control unit 71 supplies serial data to the receiver circuit 2 via the terminal P2.

Under the control of the test control unit 71, the clock generation unit 72 generates the above reference clock and supplies it to the receiver circuit 2 via the terminal P3.

The test result detection unit 73 detects test results in the receiver circuit 2, such as a result of a comparison by the comparator unit 15 of the receiver circuit 2 and a result of detection by the jitter characteristic detector unit 17.

The storage unit 74 stores a test program 74a executed by the test control unit 71. The storage unit 75 stores a test program 75a executed by the test result detection unit 73 and a test log 75b. In the example of FIG. 15, the test control unit 71 and the test result detection unit 73 read the test programs 74a and 75a respectively. However, the test control unit 71 may control the test result detection unit 73 in accordance with the test program 74a. Furthermore, in the example of FIG. 15, the two storage units 74 and 75 are included. However, the number of storage units may be one or three or more.

(Jitter Tolerance Test)

The flow of a jitter tolerance test performed by the use of the above tester 70 will now be described.

Figure 16:
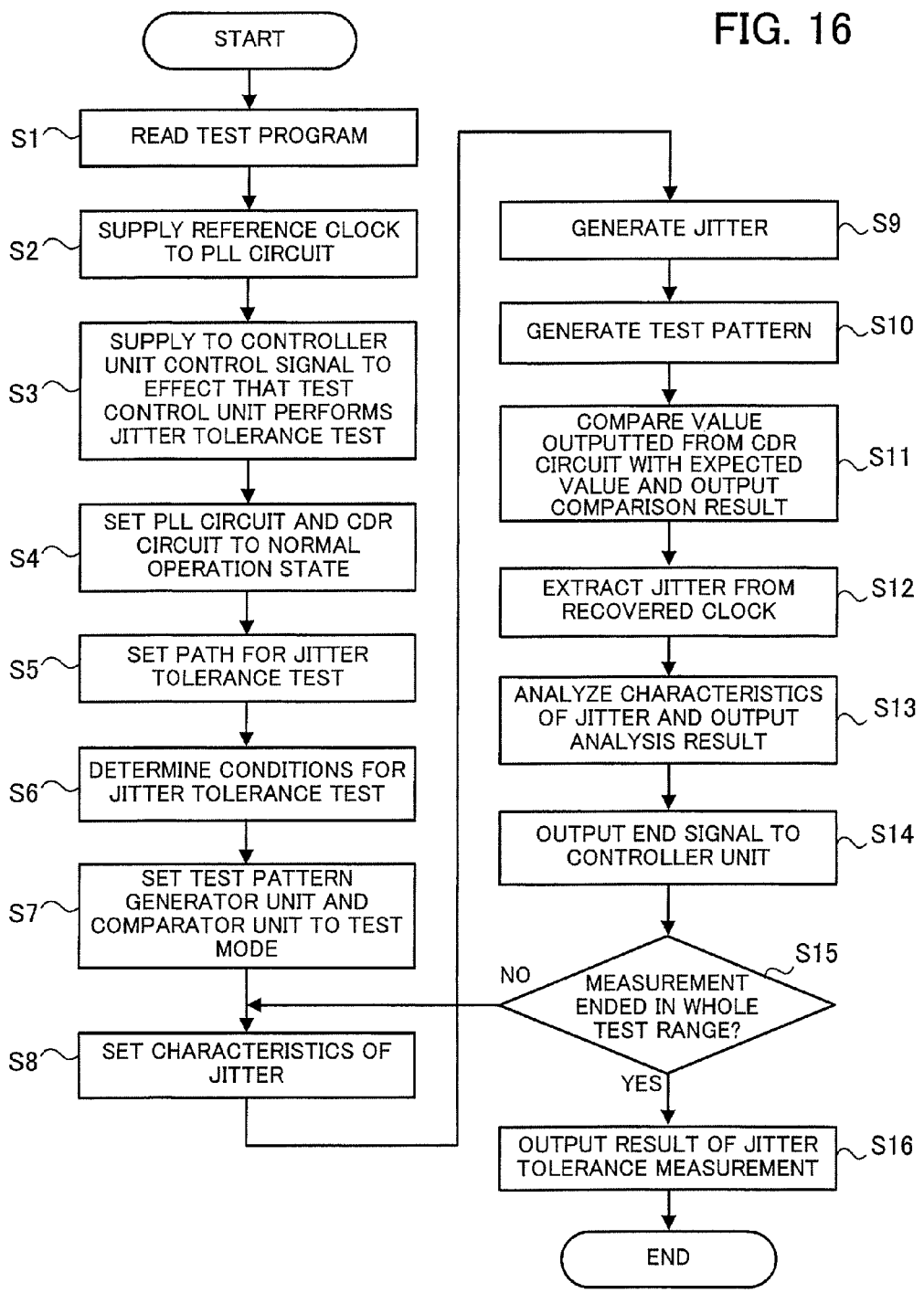
FIG. 16 is a flow chart of an example of a jitter tolerance test.

FIG. 16 is a flow chart of an example of a jitter tolerance test.

First the test control unit 71 of the tester 70 reads the test program 74a from the storage unit 74 (step S1).

Under the control of the test control unit 71, the clock generation unit 72 generates a reference clock and supplies it to the PLL circuit 10 of the receiver circuit 2 (step S2).

Furthermore, the test control unit 71 supplies to the controller unit 18 of the receiver circuit 2 a control signal to the effect that it performs a jitter tolerance test (step S3).

When the controller unit 18 of the receiver circuit 2 receives the control signal to the effect that the test control unit 71 performs a jitter tolerance test, the controller unit 18 of the receiver circuit 2 changes the PLL circuit 10 and the CDR circuit 14 from a standby state to a normal operation state (step S4).

In addition, the controller unit 18 transmits selection signals to the selector units 13*a*, 13*b*, and 13*c* to set a path for the jitter tolerance test (step S5). As a result, a path along which serial data is transmitted from the test control unit 71 to the CDR circuit 14 and a path along which parallel data and a recovered clock are transmitted from the CDR circuit 14 to the internal circuit 3 corresponding to a link layer are blocked.

Next, the controller unit 18 determines conditions for the jitter tolerance test (step S6). For example, the controller unit 18 determines a test range of frequencies and amplitude of jitter to be generated. The conditions for the jitter tolerance test may be inputted to the tester 70 by a user and the controller unit 18 of the receiver circuit 2 may be notified of them. Alternatively, the conditions for the jitter tolerance test may be stored in advance in, for example, the storage unit 74 of the tester 70.

After that, the controller unit 18 sets the test pattern generator unit 12 and the comparator unit 15 to test mode (step S7). For example, if the test pattern generator unit 12 and the comparator unit 15 generate a test pattern and an expected value, respectively, by the use of PRBS generation circuits, then a generating polynomial (see FIG. 6) to be used is determined.

Furthermore, the jitter generator unit 11 sets the characteristics (frequency and amplitude) of jitter to be generated under the control of the controller unit 18 (step S8). The controller unit 18 transmits a modulation code like those indicated in FIG. 3 to the jitter generator unit 11 on the basis of the contents determined in step S6.

After the controller unit 18 sets initial values for the jitter generator unit 11, the jitter extractor unit 16, and the jitter characteristic detector unit 17, the jitter generator unit 11 generates jitter having the designated characteristics and adds it to the reference clock transmitted thereto via the PLL circuit 10 (step S9).

On the basis of the reference clock to which the jitter has been added, the test pattern generator unit generates a test pattern by the use of, for example, the generating polynomial determined in step S7 (step S10).

The comparator unit 15 generates an expected value by the use of, for example, the generating polynomial determined in step S7, compares it with a value outputted from the CDR circuit 14, and outputs a comparison result to the tester 70 (step S11). For example, if the value outputted from the CDR circuit 14 matches the expected value in step S11, then a "Pass" signal is outputted to the tester 70. If the value outputted from the CDR circuit 14 does not match the expected value in step S11, then a "Fail" signal is outputted to the tester 70.

Furthermore, the jitter extractor unit 16 extracts the jitter from the recovered clock outputted from the CDR circuit 14 (step S12). At this time a band-pass filter like that illustrated in FIG. 11 or 12 is used.

Then the jitter characteristic detector unit 17 analyzes the characteristics of the extracted jitter and outputs an analysis result to the tester 70 (step S13). In step S13, for example, a modulation code corresponding to a frequency and amplitude of the jitter detected is generated and the modulation code is compared with an expected value. If they match, then a "Pass" signal is outputted to the tester 70. If they do not match, then a "Fail" signal is outputted to the tester 70. The comparison result and the analysis result outputted to the tester 70 in steps S11 and S13, respectively, are detected by the test result detection unit 73 and are stored in, for example, the storage unit 75 as the test log 75*b*.

After that, the jitter characteristic detector unit 17 outputs to the controller unit 18 an end signal to the effect that measurement based on the set jitter characteristics has ended (step S14).

The controller unit 18 determines whether or not measurement has ended in the whole test range of frequencies and amplitude of jitter determined in step S6 (step S15). If measurement has not ended in the whole test range of frequencies and amplitude of jitter determined in step S6, then the process is repeated from step S8 by the use of the next jitter characteristic values (above modulation code, for example).

If measurement has ended in the whole test range of frequencies and amplitude of jitter determined in step S6, then the test result detection unit 73 outputs a result of jitter tolerance measurement (step S16).

In FIG. 16, the order of the steps is not limited to the above order. That is to say, the above order may be changed properly. For example, steps S12 and S13 may be performed before step S11 in which the comparator unit 15 compares the value outputted from the CDR circuit 14 with the expected value.

Figure 17:
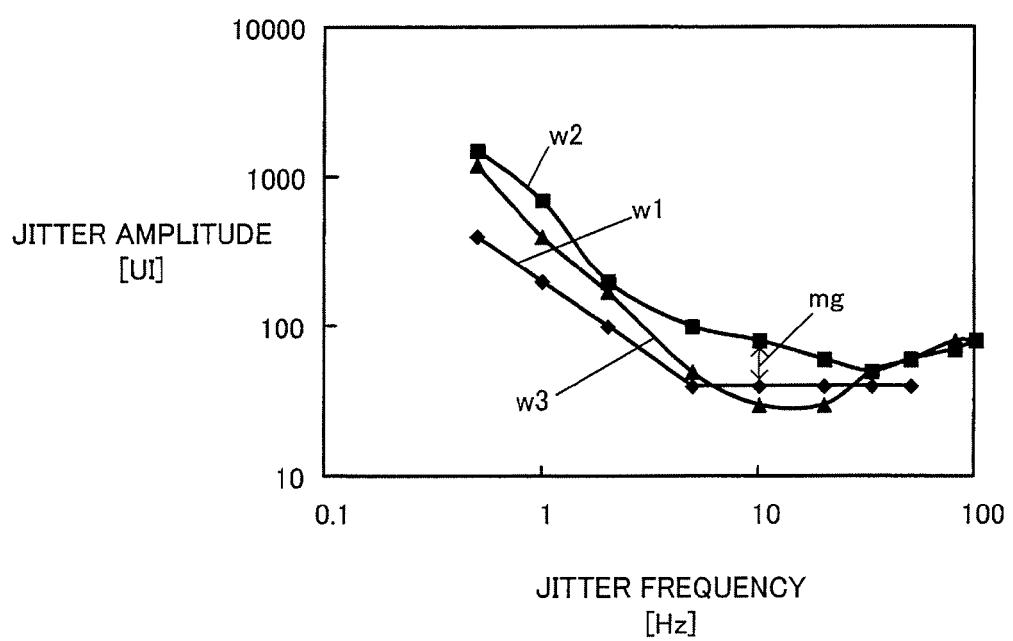
FIG. 17 is an example of a result of jitter tolerance measurement.

FIG. 17 is an example of a result of jitter tolerance measurement. In FIG. 17, a horizontal axis indicates a jitter frequency (Hz) and a vertical axis indicates jitter amplitude (UI).

In FIG. 17, a jitter tolerance mask (guarantee range of jitter characteristics) of the receiver circuit 2 using the CDR circuit 14 based on USB (Universal Serial Bus) 3.0 is indicated by a waveform w1. The CDR circuit 14 correctly holds data, preferably in a region in which jitter amplitude is larger than the waveform w1 at each frequency.

A waveform w2 indicates an example of jitter characteristics at the time of data being held correctly at each frequency ("Pass") in a jitter tolerance test performed on the semiconductor integrated circuit 1 and the receiver circuit 2 according to the embodiment.

Furthermore, a waveform w3 indicates an example of jitter characteristics at the time of data not being held correctly at some frequency ("Fail") in a jitter tolerance test performed on the semiconductor integrated circuit 1 and the receiver circuit 2 according to the embodiment.

These waveforms w2 and w3 are obtained. Accordingly, extremal characteristics, such as a peak, of the CDR circuit 14 can be checked and the characteristics themselves of the CDR circuit 14 can be detected. In addition, a margin mg at each frequency between the waveform w2 and the jitter tolerance mask indicated by the waveform w1 can be detected.

If the result "Pass" is obtained at each frequency on the basis of the jitter characteristics indicated by the waveform w3, then the result "Pass" is obtained at a jitter frequency of 10 MHz in a region under the waveform w1. The fact that such a case does not fall within the guarantee range is also detected by the jitter tolerance test in the embodiment.

(Example to which Semiconductor Integrated Circuit and Receiver Circuit According to Embodiment are Applied)

Figure 18:
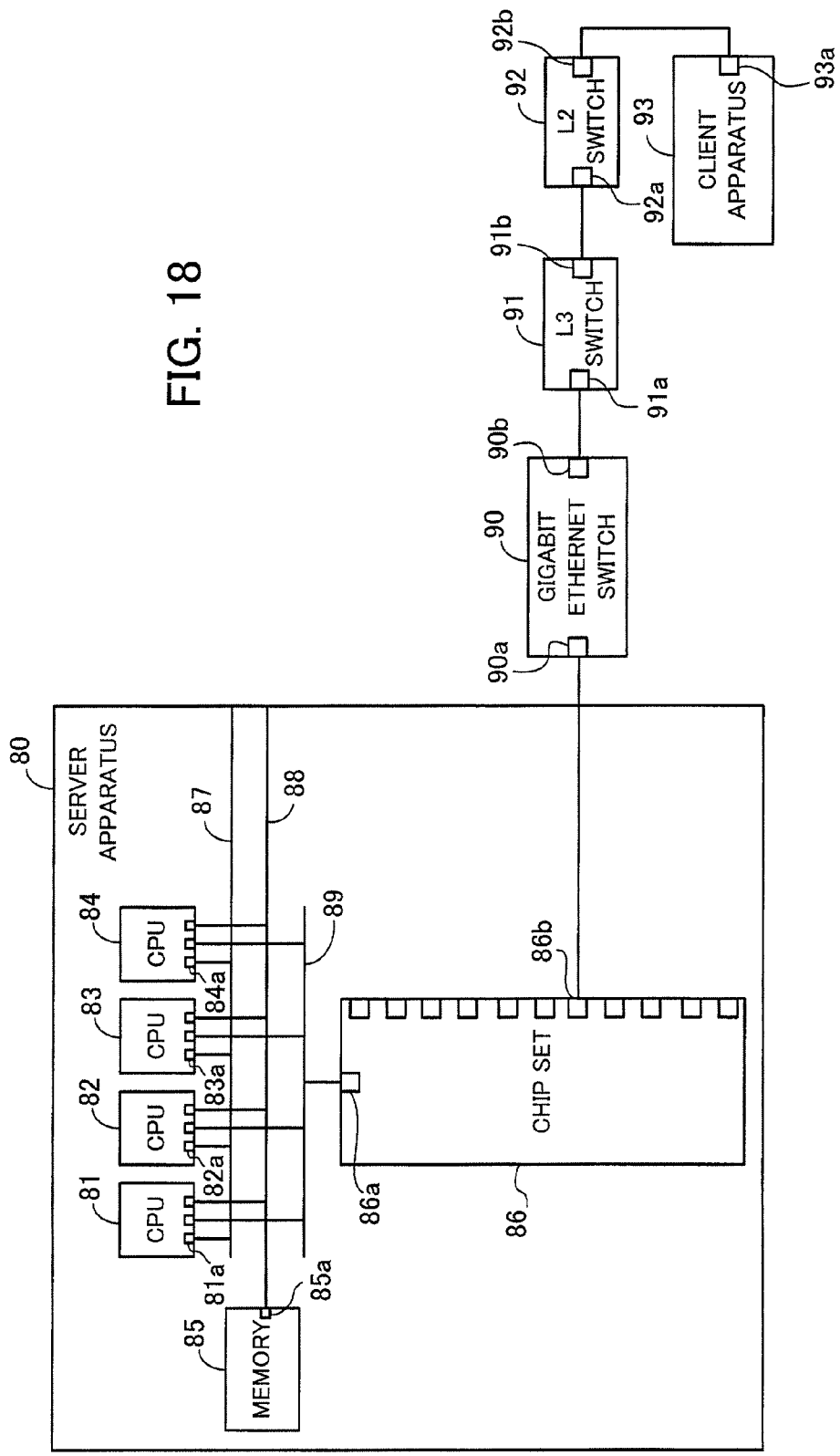
FIG. 18 is an example of a server apparatus and its peripherals.

FIG. 18 is an example of a server apparatus and its peripherals.

A server apparatus 80 includes CPUs (Central Processing Units) 81, 82, 83, and 84, a memory 85, a chip set (circuit section including a plurality of semiconductor integrated circuits (chips)) 86, and buses 87, 88, and 89.

The bus 87 which connects the CPUs 81 through 84 is based on, for example, the PCI (Peripheral Component Interconnect) Express Gen3 standard. The bus 88 which connects the CPUs 81 through 84 and the memory 85 is based on, for example, DDR3 (Double Data Rate 3). The bus 89 which connects the CPUs 81 through 84 and the chip set 86 is based on, for example, DMI (Desktop Management Interface).

The CPUs 81 through 84 include a plurality of interface circuits 81a, 82a, 83a, and 84a, respectively, so as to accommodate the above standards. The memory 85 and the chip set 86 also include interface circuits 85a and 86a respectively.

Furthermore, the chip set 86 includes a plurality of interface circuits 86b corresponding to a plurality of standards to make a connection with a peripheral outside the server apparatus 80.

Interface standards include USB 3.0, serial ATA (Advanced Technology Attachment), SM (System Management) Bus, and SPI (Serial Peripheral Interface) Flash in addition to the above PCI Express Gen3. Furthermore, interface standards include Super I/O (Input/Output), SAS (Serial Attached SCSI (Small Computer System Interface)), LAN (Local Area Network) 10Gbase, Express Card, WLAN (Wireless LAN), and the like.

In the example of FIG. 18, a Gigabit Ethernet (registered trademark) switch 90 is connected to an interface circuit 86b corresponding to LAN 10Gbase. An L3 (Layer-3) switch 91 is connected to the Gigabit Ethernet switch 90. An L2 switch 92 is connected to the L3 switch 91. In addition, a client apparatus, such as a PC (Personal Computer), 93 is connected to the L2 switch 92. The L3 switch 91 may be connected to an access point of a wireless LAN.

These peripherals include interface circuits 90a and 90b, 91a and 91b, 92a and 92b, and 93a respectively.

The semiconductor integrated circuit 1 and the receiver circuit 2 illustrated in FIG. 1 can be applied to, for example, each of the above interface circuits.

According to the disclosed receiver circuit, semiconductor integrated circuit, and test method, the accuracy of a jitter tolerance test can be improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A receiver circuit comprising:
a clock data recovery circuit;
a jitter generator configured to generate jitter having first characteristics which include a first frequency and a first amplitude of the jitter;
a test pattern generator configured to generate a test pattern to which the jitter is added and to supply the test pattern to the clock data recovery circuit;
a comparator configured to compare a value outputted from the clock data recovery circuit on the basis of the test pattern with an expected value and to output a comparison result;
a jitter extractor configured to extract jitter from a clock recovered by the clock data recovery circuit; and
a jitter characteristic detector configured to detect a second frequency and a second amplitude of the extracted jitter and to evaluate the second frequency and the second amplitude with the first frequency and the first amplitude of the jitter set by the jitter generator as expected values,
wherein the jitter generator generates the jitter based on a first digital code which represents a first combination of the first frequency and the first amplitude of the jitter.

2. The receiver circuit according to claim 1, wherein the jitter characteristic detector generates a second digital code which represents a second combination of the second frequency and the second amplitude and compares the first digital code with the second digital code and outputs a second comparison result.

3. A semiconductor integrated circuit comprising:
an internal circuit; and
a receiver circuit including:
a clock data recovery circuit configured to recover data and a clock from a received signal and to supply the data and the clock to the internal circuit;
a jitter generator configured to generate jitter having first characteristics which include a first frequency and a first amplitude of the jitter;
a test pattern generator configured to generate a test pattern to which the jitter is added and to supply the test pattern to the clock data recovery circuit; and
a comparator configured to compare a value outputted from the clock data recovery circuit on the basis of the test pattern with an expected value and to output a comparison result;
a jitter extractor configured to extract jitter from a clock recovered by the clock data recovery circuit; and
a jitter characteristic detector configured to detect a second frequency and a second amplitude of the extracted jitter and to evaluate the second frequency and the second amplitude with the first frequency and the first amplitude of the jitter set by the jitter generator as expected values,
wherein the jitter generator generates the jitter based on a first digital code which represents a first combination of the first frequency and the first amplitude of the jitter.

4. The semiconductor integrated circuit according to claim 3, wherein the jitter characteristic detector generates a second digital code which represents a second combination of the second frequency and the second amplitude and compares the first digital code with the second digital code and outputs a second comparison result.

5. A test method comprising:
generating jitter having first characteristics which include a first frequency and a first amplitude of the jitter in a receiver circuit including a clock data recovery circuit;
generating a test pattern to which the jitter is added and supplying the test pattern to the clock data recovery circuit;
comparing a value outputted from the clock data recovery circuit with an expected value and outputting a comparison result;
extracting jitter from a clock recovered by the clock data recovery circuit;
detecting a second frequency and a second amplitude of the extracted jitter; and
evaluating the second frequency and the second amplitude with the first frequency and the first amplitude of the jitter set by a jitter generator as expected values, wherein the generating jitter includes generating the jitter based on a first digital code which represents a first combination of the first frequency and the first amplitude of the jitter.

6. The test method according to claim 5, further comprising:
   generating a second digital code which represents a second combination of the second frequency and the second amplitude;
   comparing the first digital code with the second digital code; and
   outputting a second comparison result.

* * * * *